(12) United States Patent
O'Keefe

(10) Patent No.: US 8,502,258 B2
(45) Date of Patent: Aug. 6, 2013

(54) LIGHT EMITTING STRUCTURE AND METHOD OF MANUFACTURE THEREOF

(75) Inventor: Matthew F. O'Keefe, Aycliffe (GB)

(73) Assignee: RFMD (UK) Limited, Newton Aycliffe (GB)

( * ) Notice: Subject to any disclaimer, the term of this patent is extended or adjusted under 35 U.S.C. 154(b) by 189 days.

(21) Appl. No.: 12/705,869

(22) Filed: Feb. 15, 2010

(65) Prior Publication Data

US 2010/0230656 A1    Sep. 16, 2010

(30) Foreign Application Priority Data

Feb. 16, 2009   (GB) .................................. 0902558.6

(51) Int. Cl.
*H01L 33/00*   (2010.01)

(52) U.S. Cl.
USPC .................... 257/99; 257/79; 257/E33.056

(58) Field of Classification Search
USPC .................................................. 257/E33.056
See application file for complete search history.

(56) References Cited

U.S. PATENT DOCUMENTS

| | | | |
|---|---|---|---|
| 5,389,571 A | 2/1995 | Takeuchi et al. | |
| 5,764,673 A | 6/1998 | Kawazu et al. | |
| 5,914,501 A | 6/1999 | Antle et al. | |
| 6,133,589 A | 10/2000 | Krames et al. | |
| 6,376,864 B1 | 4/2002 | Wang | |
| 6,593,597 B2 | 7/2003 | Sheu | |
| 6,861,677 B2 | 3/2005 | Chen | |
| 7,015,512 B2 | 3/2006 | Park et al. | |
| 7,042,150 B2 | 5/2006 | Yasuda | |
| 7,053,420 B2 | 5/2006 | Tadatomo et al. | |
| 7,211,822 B2 | 5/2007 | Nagahama et al. | |
| 7,974,322 B2 | 7/2011 | Ueda et al. | |
| 2003/0122139 A1* | 7/2003 | Meng et al. ................ | 257/81 |
| 2005/0271107 A1 | 12/2005 | Murakami et al. | |
| 2006/0043385 A1 | 3/2006 | Wang et al. | |
| 2006/0068601 A1* | 3/2006 | Lee et al. .................... | 438/761 |
| 2006/0243988 A1 | 11/2006 | Narukawa et al. | |
| 2007/0093009 A1 | 4/2007 | Baptist et al. | |
| 2007/0295985 A1* | 12/2007 | Weeks et al. ................ | 257/103 |
| 2008/0112448 A1* | 5/2008 | Ueda et al. .............. | 372/44.011 |
| 2008/0121876 A1 | 5/2008 | Otsuka et al. | |
| 2008/0272382 A1 | 11/2008 | Kim et al. | |
| 2008/0283821 A1 | 11/2008 | Park et al. | |
| 2010/0133567 A1 | 6/2010 | Son | |
| 2011/0163342 A1 | 7/2011 | Kim et al. | |

FOREIGN PATENT DOCUMENTS

| | | |
|---|---|---|
| EP | 1187229 A1 | 3/2002 |
| JP | 10-242584 A | 9/1998 |
| JP | 2000-031535 A | 1/2000 |
| JP | 2003-332618 A | 11/2003 |
| WO | 2004/051707 A3 | 6/2004 |

OTHER PUBLICATIONS

Search Report for GB0902558.6, issued Jun. 16, 2010, by the UK Intellectual Property Office.

(Continued)

*Primary Examiner* — Daniel Whalen
(74) *Attorney, Agent, or Firm* — Withrow & Terranova, P.L.L.C.

(57) ABSTRACT

A semiconductor structure having an electrically conducting silicon substrate and a GaN semiconductor device separated from the substrate by a buffer layer is provided. The buffer layer electrically connects the silicon substrate with the GaN semiconductor device. In addition, a GaN LED arranged in a flip chip orientation on the buffer layer on the substrate is provided.

9 Claims, 9 Drawing Sheets

OTHER PUBLICATIONS

Figure 1:
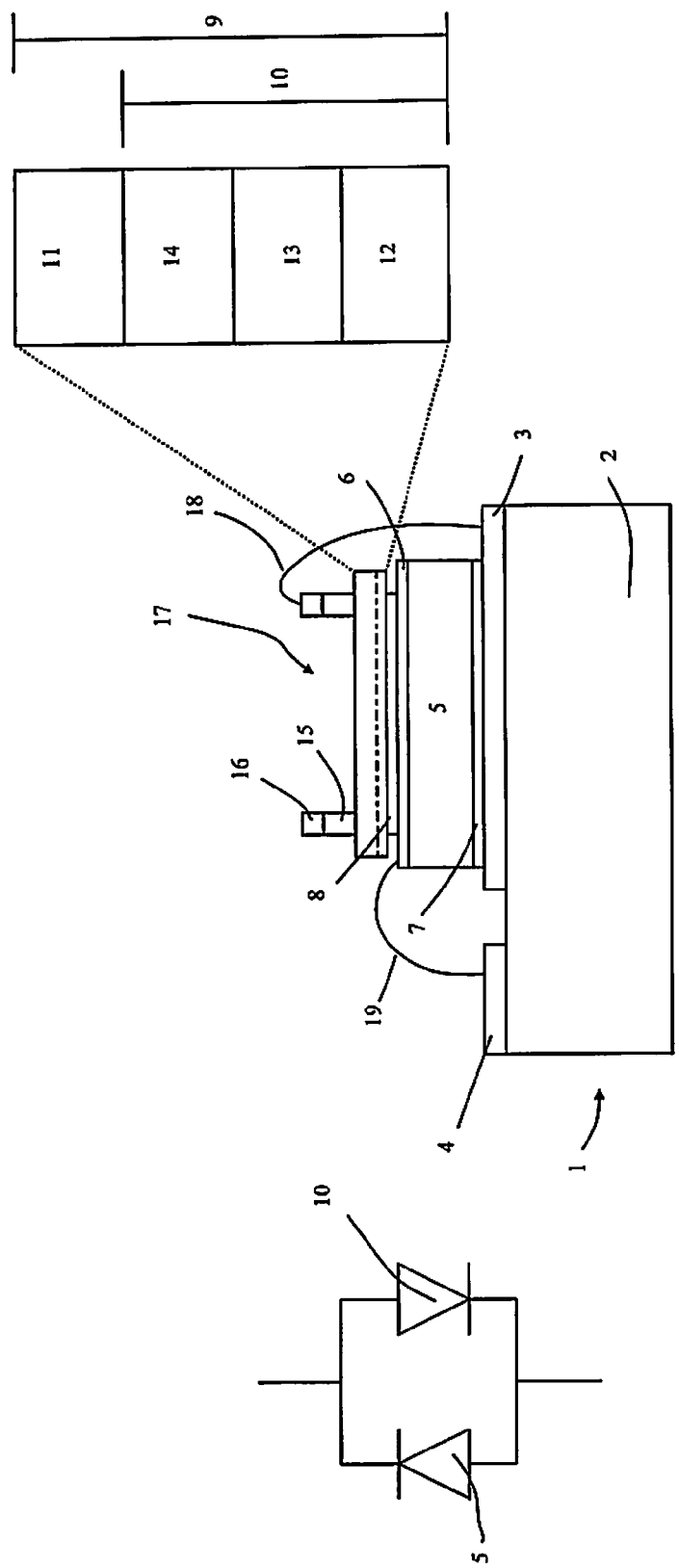

Non-Final Rejection mailed May 2, 2012, for U.S. Appl. No. 12/841,225, 11 pages.
Chang, S.J. et al., "Improved ESD protection by combining InGaN-GaN MQW LEDs with GaN Schottky diodes," IEEE Electron Device Letters, Mar. 2003, vol. 24, No. 3, pp. 129-131.
Fath, P. et al., "Mechanical wafer engineering for high efficiency solar cells: An investigation of the induced surface damage," Conference Record of the Twenty-Fourth IEEE Photovoltaic Specialists Conference, Dec. 5-9, 1994, vol. 2, pp. 1347-1350.
Han, D.S. et al., "Improvement of Light Extraction Efficiency of Flip-Chip Light-Emitting Diode by Texturing the Bottom Side Surface of Sapphire Substrate," IEEE Photonics Technology Letters, Jul. 2006, vol. 18, No. 13, pp. 1406-1408.
Lee, S.J., "Study of photon extraction efficiency in InGaN light-emitting diodes depending on chip structures and chip-mount schemes," Optical Engineering, SPIE, Jan. 2006, vol. 45, No. 1, 14 pages.
Windisch, R. et al., "40% Efficient Thin-Film Surface-Textured Light-Emitting Diodes by Optimization of Natural Lithography," IEEE Transactions on Electron Devices, Jul. 2000, vol. 47, No. 7, pp. 1492-1498.
Windisch, R. et al., "Impact of texture-enhanced transmission on high-efficiency surface-textured light-emitting diodes," Applied Physics Letters, Oct. 8, 2001, vol. 79, No. 15, pp. 2315-2317.
Wierer, J. et al., "High-power AIGaInN flip-chip light-emitting diodes," Applied Physics Letters, vol. 78 No. 22, May 28, 2001, pp. 3379-3381.
Hibbard, D.L. et al., "Low resistance high relectance contacts to p-GaN using oxidized Ni/Au and Al or Ag," Applied Physics Letters, vol. 83 No. 2, Jul. 14, 2003, pp. 311-313.
Shchekin, O.B. et al., "High performance thin-film flip-chip InGaN-GaN light-emitting diodes," Applied Physics Letters, vol. 89, 071109, Aug. 2006, 4 pages.
Chao, C-H. et al., "Theoretical demonstration of enhancement of light extraction of flip-chip GaN light-emitting diodes with photonic crystals," Applied Physics Letters, vol. 89, 2006, 4 pages.
Non-final Office Action for U.S Appl. No. 12/841,225 mailed Dec. 22, 2011, 11 pages.
Non-final Office Action for U.S. Appl. No. 12/841,257 mailed Jan. 5, 2012, 16 pages.
Final Office Action for U.S. Appl. No. 12/841,225 mailed Feb. 1, 2012, 9 pages.
Non-final Office Action for U.S. Appl. No. 12/841,225 mailed Jul. 5, 2012, 8 pages.
Examination report for British application 0902558.6 mailed Nov. 16, 2012, 5 pages.
Examination report for British application 0902558.6 mailed Feb. 28, 2013, 2 pages.

* cited by examiner

LIGHT EMITTING STRUCTURE AND METHOD OF MANUFACTURE THEREOF

FIELD OF THE INVENTION

This application claims priority to UK patent application number 0902558.6, filed Feb. 16, 2009, the disclosure of which is incorporated herein by reference in its entirety.

The present invention relates to a semiconductor structure and a method of manufacture thereof. More particularly, but not exclusively, the present invention relates to a semiconductor structure comprising an electrically conducting silicon substrate and a GaN semiconductor device separated from the substrate by a buffer layer. The substrate and semiconductor device are in electrical contact through the buffer layer. More particularly, but not exclusively, the present invention relates to a GaN LED arranged in a flip chip orientation on the buffer layer on the substrate. In a further aspect, the present invention relates to a method of manufacture of such a structure.

BACKGROUND OF THE INVENTION

GaN semiconductor devices grown on high resistivity silicon or silicon carbide substrates are known. Such semiconductor devices are typically RF devices. The substrates have high resistivity to reduce microwave loss. In order to make contact to the underside of the semiconductor device small apertures are provided in the substrate and contact is made through the apertures. This significantly increases the complexity of the assembly of the device.

In addition, growth of GaN LED devices on insulating transparent substrates (for example sapphire) is also known. As the substrate is insulating connections are made to the LED from above. This complicates manufacture.

SUMMARY OF THE INVENTION

The semiconductor structure according to the invention seeks to overcome the drawbacks of the prior art.

In a first aspect, the present invention provides a semiconductor structure comprising:
an electrically conducting silicon substrate;
a buffer layer on the substrate; and
a GaN semiconductor device on the buffer layer, the GaN semiconductor device being electrically connected to the silicon substrate.

Because the silicon substrate is electrically conducting one can make electrical contact to the underside of the GaN based semiconductor device by making an ohmic contact to the silicon substrate. This considerably simplifies manufacture of semiconductor structure.

Preferably, the silicon substrate only partially covers the buffer layer.

Preferably, an aperture extends though the silicon substrate adjacent to the semiconductor device.

Preferably, the resistivity of the silicon is less than 1 kΩ.cm, preferably in the range 0.5 to 100 Ω.cm.

Preferably the buffer layer is electrically conducting and electrically connects the substrate and semiconductor device together.

The buffer layer can comprise at least one AlN layer.

The semiconductor structure can further comprise an ohmic contact connected to the silicon substrate.

The face of the silicon substrate in contact with the buffer layer can be a {111} plane.

The face of the substrate in contact with the buffer layer can comprise at least one groove, at least one side of the groove being a {111} plane.

The semiconductor structure can comprise a diode connected to the GaN semiconductor device.

The further diode can comprise p and n type silicon layers in the silicon substrate.

Preferably, the GaN semiconductor device comprises a GaN LED comprising a p type layer and an n type layer.

The GaN LED can comprise a multiple quantum well structure sandwiched between the p and n layers.

Preferably, the n type GaN layer is arranged between the p type GaN layer and the buffer layer.

Preferably, the semiconductor structure further comprises an optically reflecting ohmic contact connected to the p type GaN layer.

The GaN semiconductor device can comprise at least one of a Schottky diode, a PIN diode or a vertical FET.

In a further aspect of the invention there is provided a method of manufacture of a semiconductor structure comprising:
providing an electrically conducting silicon substrate;
providing a buffer layer on the substrate; and
providing a GaN semiconductor device on the buffer layer, the GaN semiconductor device being electrically connected to the silicon substrate.

Preferably, the electrical resistivity of the silicon substrate is less than 1 kΩ.cm, preferably in the range 0.5 to 100 Ω.cm.

Preferably, the GaN semiconductor device comprises a GaN LED comprising a p type GaN layer and an n type GaN layer, the n type layer being arranged between the p type layer and the buffer layer.

Preferably, the method further comprises the step of etching through the substrate to the buffer layer.

The method can further comprise the step of providing an optically reflective ohmic contact layer on the p type layer.

Those skilled in the art will appreciate the scope of the present invention and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the invention, and together with the description serve to explain the principles of the invention.

FIG. 1 shows an embodiment of a semiconductor structure according to the invention; and, FIGS. 2(a) to 2(h) show steps in the manufacture of the semiconductor structure by a method according to the invention.

DETAILED DESCRIPTION OF THE PREFERRED EMBODIMENTS

The embodiments set forth below represent the necessary information to enable those skilled in the art to practice the invention and illustrate the best mode of practicing the invention. Upon reading the following description in light of the accompanying drawing figures, those skilled in the art will understand the concepts of the invention and will recognize applications of these concepts not particularly addressed herein. It should be understood that these concepts and applications fall within the scope of the disclosure and the accompanying claims.

Shown in FIG. 1 is a semiconductor structure 1 according to the invention in cross section. This semiconductor structure 1 of this embodiment is a light emitting structure. The light emitting structure 1 comprises a package heatsink 2. Arranged on the heatsink 2 are first and second electrical connections 3,4. These connections schematically represent the packaging of the device.

The structure further comprises a silicon diode 5 comprising silicon n and p type layers (not shown). The diode 5 is sandwiched between top and bottom contacts 6,7. The bottom contact 7 is arranged on and in electrical contact with the first electrical connection 3.

Arranged on the contact 6 is an optically reflecting ohmic p type contact 8. The p type contact 8 reflects the visible light incident on it. This contact 8 is described in more detail below.

Arranged on the p type contact 8 is a multilayer epitaxial structure 9. The multilayer epitaxial structure 9 comprises a GaN semiconductor device 10 which in this embodiment is a light emitting diode (LED) structure on the p type contact 8 and a buffer layer 11 thereon. The GaN LED structure 10 is in turn a multilayer structure comprising a GaN p type layer 12 on the p type contact 8, a multiple quantum well (MQW) layer 13 on the p type layer 12 and a GaN n type layer 14 on the MQW layer 13. The buffer layer 11 extends from the GaN n type layer 14 to an electrically conducting silicon substrate layer 15. Typically, the electrical resistivity of the silicon substrate 15 is less than 1 kΩ.cm, preferably in the range 0.5 to 100 Ω.cm. The buffer layer 11 allows for the lattice mismatch between the GaN and silicon layers 14, 15. In this embodiment the buffer layer 11 comprises a single layer of AlN. In alternative embodiments the buffer layer 11 is a multilayer construction comprising one or more AlN layers. In order to minimise lattice mismatch the face of the silicon 15 in contact with the buffer layer 11 is a {111} plane. Arranged on the opposite face of the silicon 15 to the buffer layer 11 is an ohmic n type contact 16. In this embodiment the buffer layer 11 is electrically conducting and electrically connects the substrate 15 and semiconductor device 10 together.

An aperture 17 extends through the silicon substrate 15 to the buffer layer 11 as shown. The aperture 17 is adjacent to the GaN LED structure 10 such that light generated by the LED 10 passes through the aperture 17. The aperture 17 also extends through the n type contact 16.

A contact wire 18 extends between the n type contact 16 and the first electrical connection 3 as shown. A further contact wire 19 extends between the top ohmic contact layer 6 on the silicon diode 5 and the second electrical connection 4 as shown. The two contact wires 18, 19 connect the silicon diode 5 and GaN LED structure 10 back to back as shown in the equivalent circuit diagram in FIG. 1. If a reverse voltage is presented across the GaN diode 10 then the silicon diode 5 conducts, preventing damage to the GaN diode 10.

FIGS. 2(a) to 2(h) show a method of manufacture of the semiconductor structure 1 according to the invention.

Figure 2A:
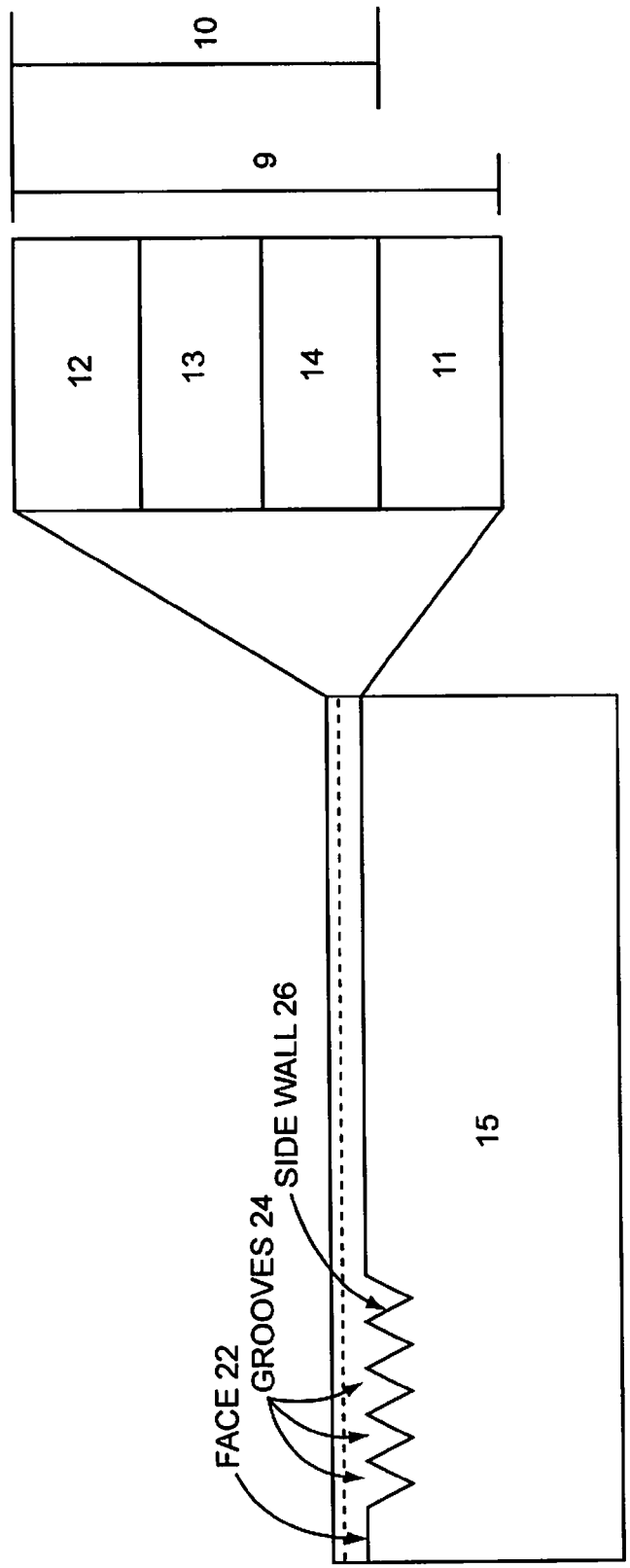

In a first step (FIG. 2(a)) a silicon substrate 15 is provided. The upper face of the silicon substrate 15 is a {111} plane. An epitaxial structure 9 is grown on the silicon substrate 15. In a first step a buffer layer 11 is grown on the silicon substrate 15. In this embodiment the buffer layer 11 is a graded AlN layer. An n type GaN layer 14 is grown on the buffer layer 11. The buffer layer 11 relieves the strain between the silicon substrate 15 and the n type GaN layer 14. A multiple quantum well layer 13 is grown on the n type GaN layer 14. A p type doped layer 12 is then grown on the MQW layer 13. P type layers 12 can be difficult to grow and consequently require a p type activation anneal at around 500 deg C. The subsequent step of forming a p type ohmic contact (see below) includes a similar low temperature anneal. An advantage of the method of the current invention is that it allows this relatively low temperature anneal to be performed early on in the process flow. Since n-type ohmic contact anneals to GaN occur at temperatures above 500 deg C. traditional 'p-contact up' structures often require mesa isolation and n-type contact formation first prior to p-type activation anneals.

Additionally in FIG. 2(a), a top face 22 of substrate 15 includes grooves 24, and a side wall 26 of one of the grooves 24 is clearly illustrated.

Figure 2B:
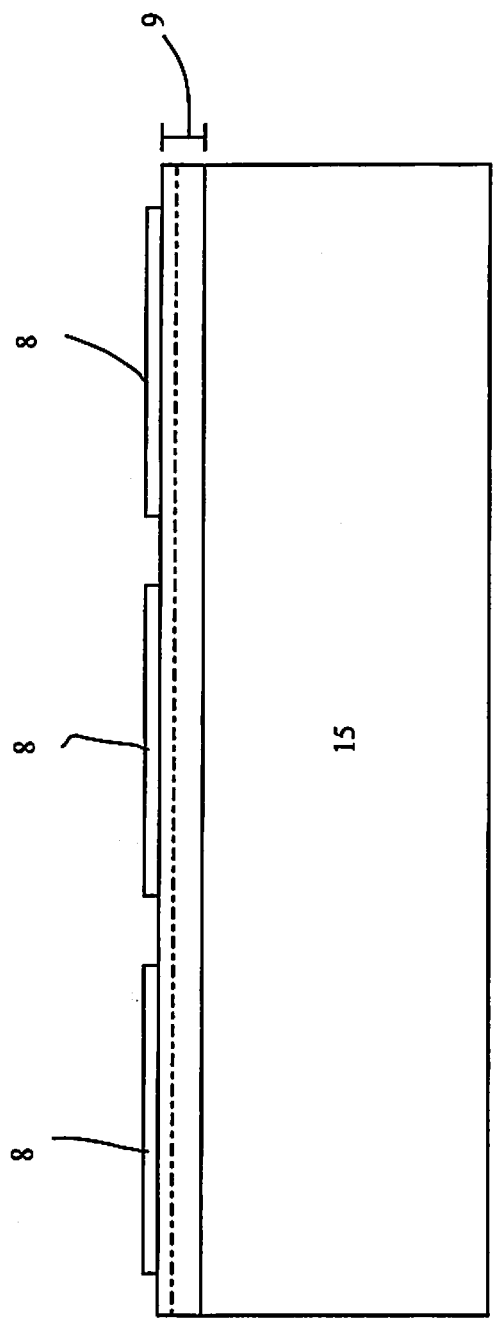

In a next step (FIG. 2(b)) an optically reflecting p type contact 8 is deposited on the p type GaN layer 12. The p type contact 8 is designed to reflect the visible light generated in the GaN LED 10. In this embodiment the p type contact 8 is a reflective plane. In practice a large number of light emitting structures 10 are grown in parallel on the same silicon substrate 15. Accordingly, a number of p type contacts 8 are deposited on the substrate in this step as shown.

Figure 2C:
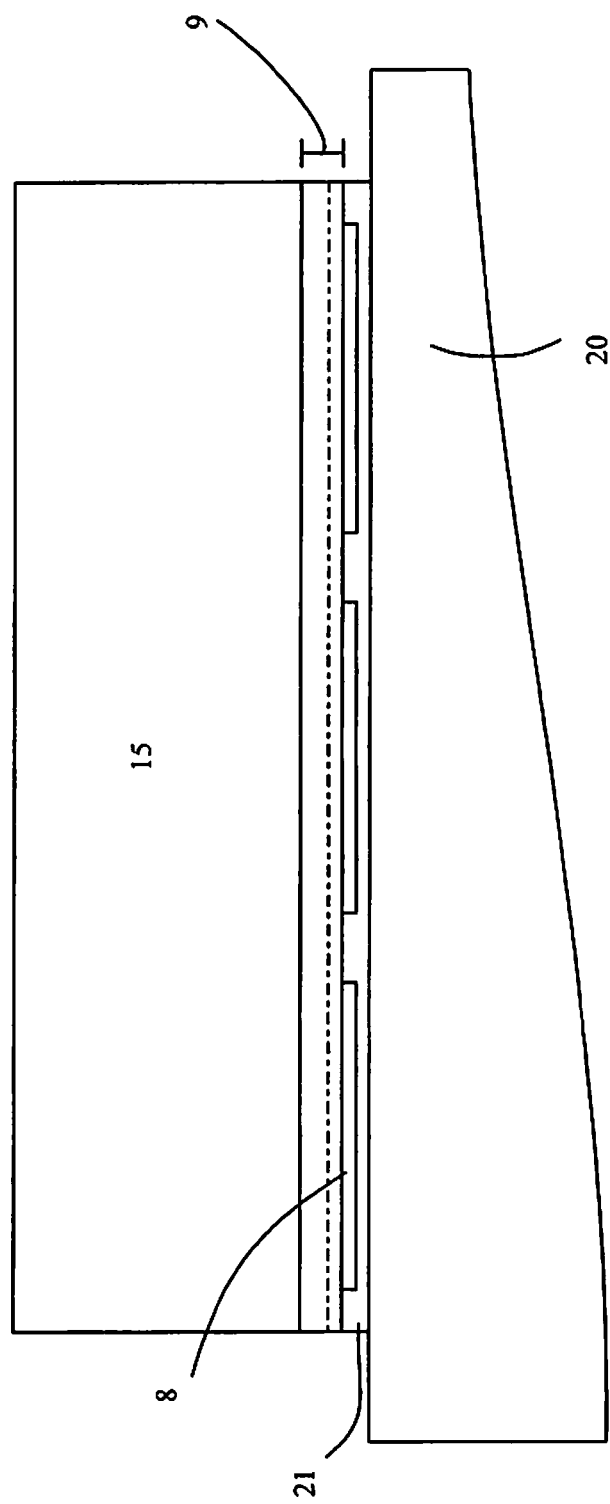

The composite structure is then mounted on a support 20 with the p type contact 8 facing towards the support 20. In this embodiment the support 20 is a reusable sapphire wafer and the structure is attached by means of a heat release adhesive film 21. This is shown in FIG. 2(c).

Figure 2D:
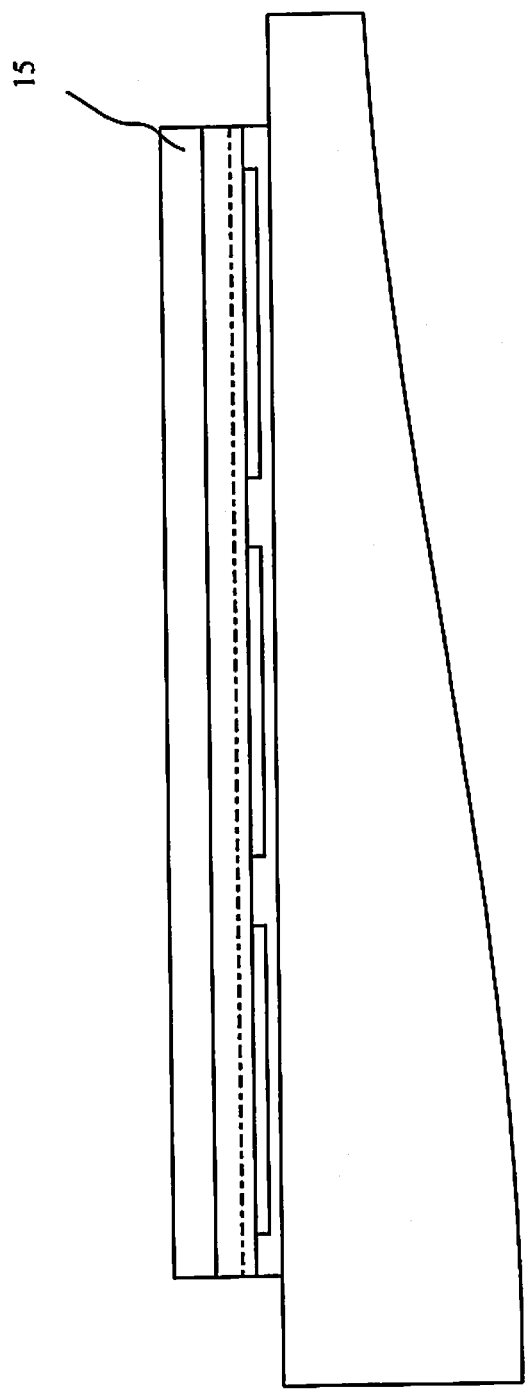
Figure 2E:
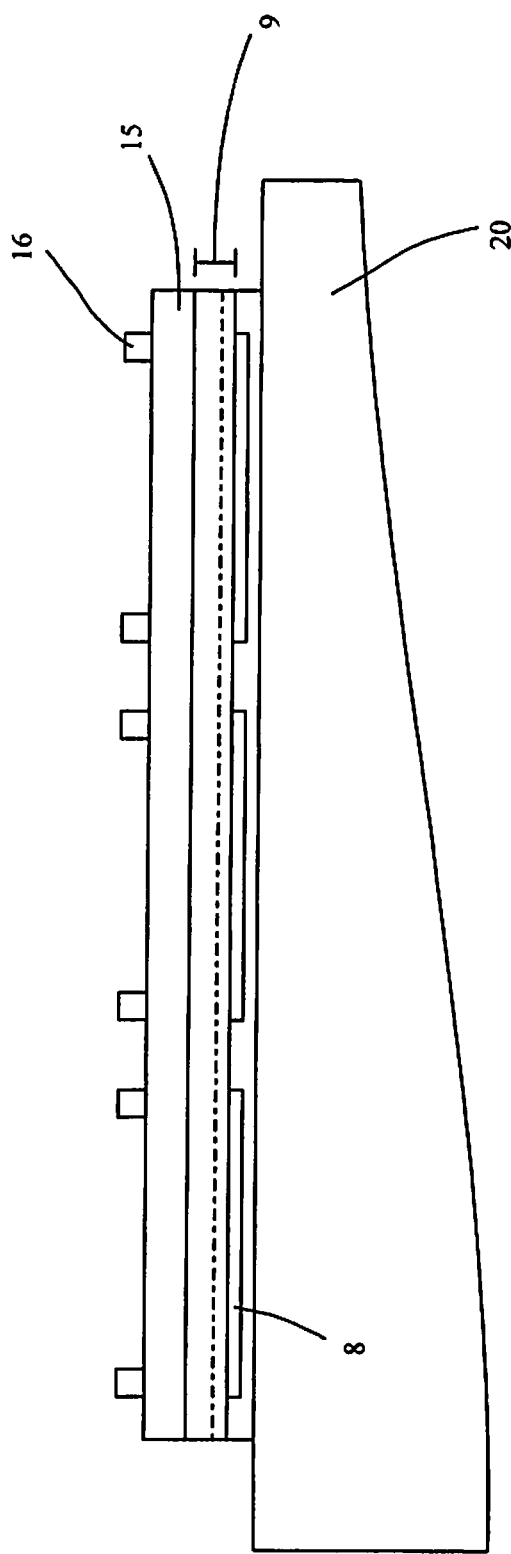

In a further step the silicon substrate 15 is thinned by grinding (FIG. 2(d)). A combination of grinding wheels allows grinding to be achieved down to less than 100 micron.

After grinding an ohmic n type contact 16 is deposited on the silicon substrate 15 (step 2(e)). Typically this is deposited in a perimeter pattern as shown with an aperture 17 extending through the contact 16 to the silicon substrate 15. Preferably, this contact 16 includes gold to take advantage of the of the relatively low temperature of the Si/Au eutectic as an ohmic contacting procedure.

Figure 2F:
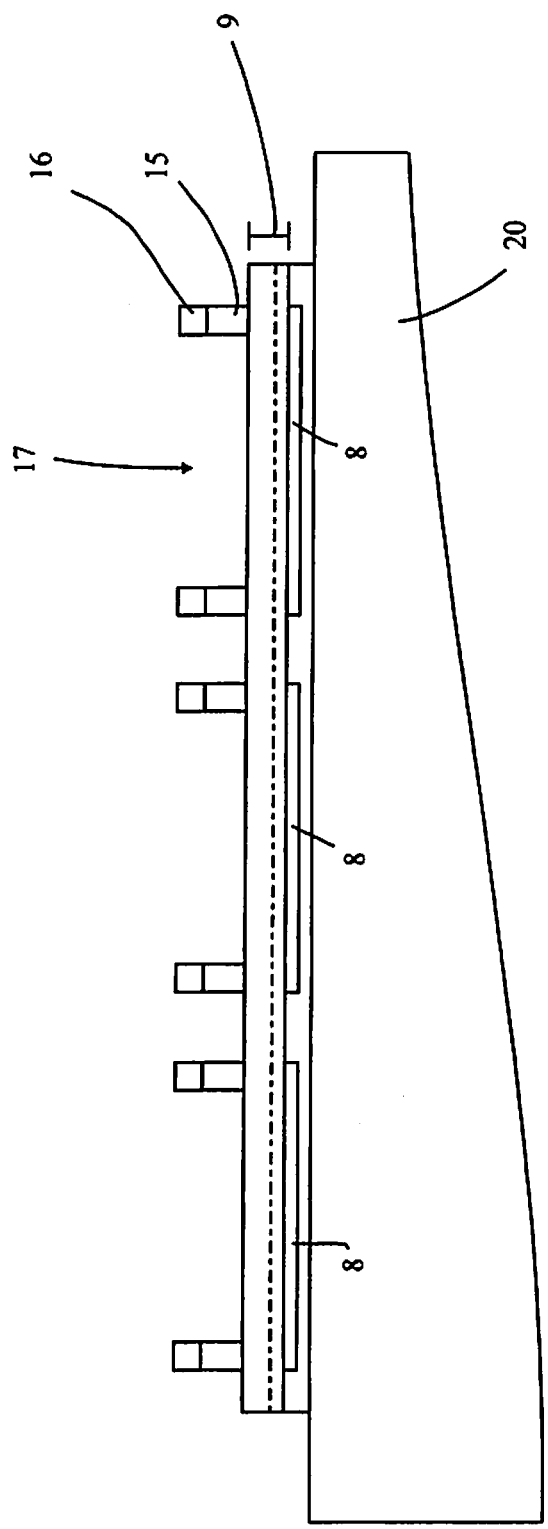

Once the ohmic n type contact 16 has been deposited on the silicon substrate 15 it is used as a mask in an etching step. Silicon below the aperture 17 in the n type contact 16 is removed by etching down to the buffer layer 11. In this embodiment this can be performed by using a chlorine based dry etch containing a small amount of fluorine which terminates on the aluminium containing buffer layer 11. This is shown in FIG. 2(f). In an alternative embodiment etching is performed in a multistep process.

Figure 2G:
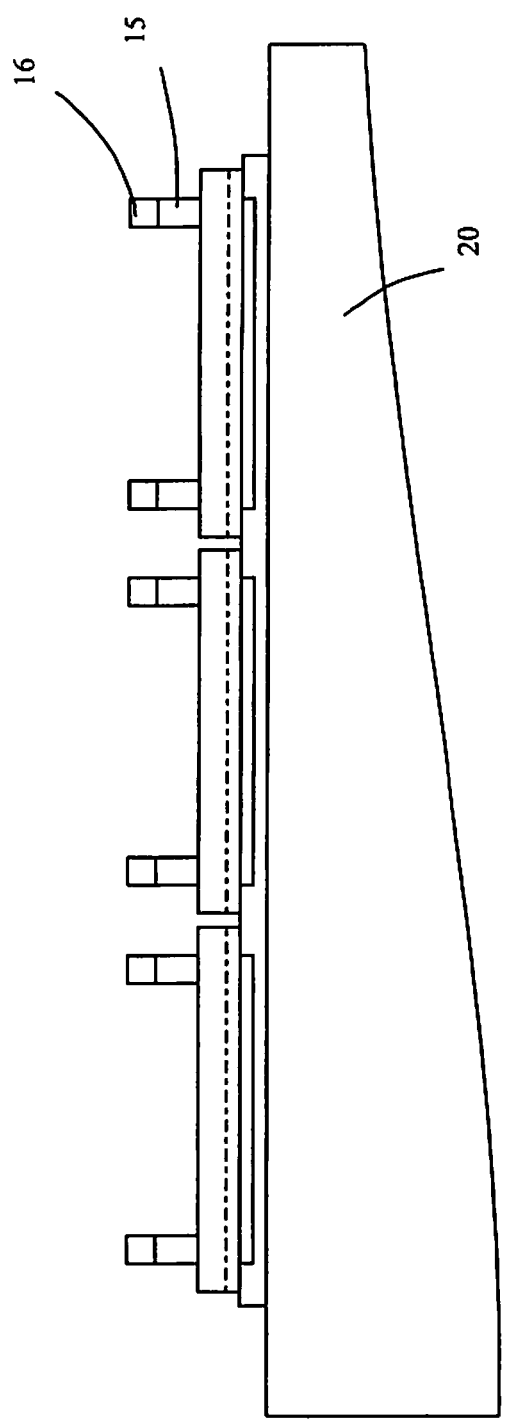
Figure 2H:
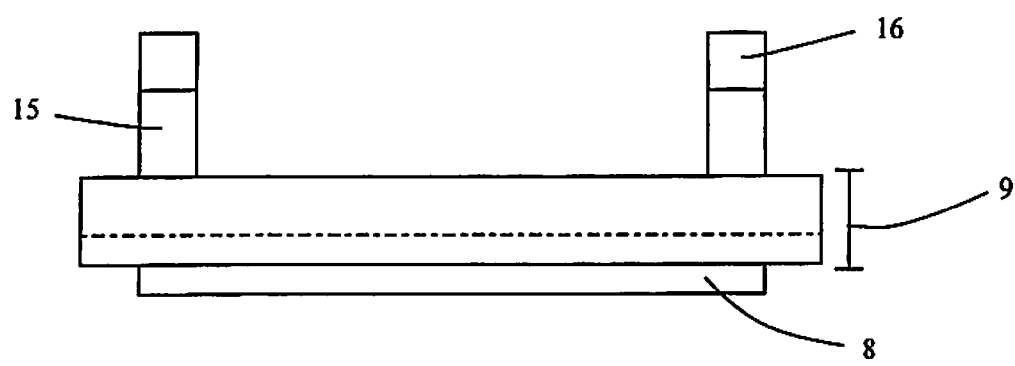

The wafers are then diced (FIG. 2(g)) and dismounted (FIG. 2(h)). The composite structure is now ready for package assembly to produce the light emitting structure of FIG. 1.

In an alternative embodiment of the invention, the upper face of the silicon substrate 15 is not a {111} plane. In this embodiment the upper face of the substrate includes a number of grooves, one or more of the side walls of which are {111} planes. The grooves can be produced mechanically or by use of a suitable etchant.

In a further alternative embodiment an aperture 17 does not extend through the silicon substrate, rather the substrate covers only a portion of the buffer layer 11.

In a further embodiment of the invention the silicon buffer layer 11 contains both p and n type layers, together forming a pn diode. This can be used to provide voltage protection in place of the silicon diode 5 of FIG. 1. In this embodiment an extra processing step is required to provide contact between the LED and the reverse protection diode.

It is not essential that the LED 10 be arranged in a flip chip orientation (ie with the p type layer on the bottom of the device). Embodiments with the reverse orientation are also possible. However, as is known in the art, flip chip orientations are to be preferred.

In alternative embodiments of the invention the GaN based semiconductor device 10 is other than an LED. The GaN based semiconductor device 10 can be a Schottky diode, a PIN diode or a vertical FET. In such embodiments it is not required that a portion of the silicon substrate be removed to form an aperture.

A GaN based semiconductor device is a term which would be understood by one skilled in the art. Such a device comprises at least one GaN layer. The layer can contain for example In or Al. The layer can be p type or n type doped or intrinsic. The GaN based semiconductor device 10 typically comprises a plurality of such layers, each layer being substantially lattice matched to the adjacent layer.

In an alternative embodiment the sapphire support is replaced by a film for separating the wafers. This is typically done after steps 2(*e*) of 2(*f*).

Those skilled in the art will recognize improvements and modifications to the preferred embodiments of the present invention. All such improvements and modifications are considered within the scope of the concepts disclosed herein and the claims that follow.

What is claimed is:

1. A semiconductor structure comprising:
   a package heatsink having a top surface;
   a first electrical connection having a top surface and a bottom surface, wherein the bottom surface of the first electrical connection contacts a first portion of the top surface of the package heatsink;
   a bottom contact having a top surface and a bottom surface, wherein the bottom surface of the bottom contact contacts the top surface of the first electrical connection;
   a silicon diode having a top surface and a bottom surface, wherein the bottom surface of the silicon diode contacts the top surface of the bottom contact;
   a top contact having a top surface and a bottom surface, wherein the bottom surface of the top contact contacts the top surface of the silicon diode;
   a reflective ohmic p type contact having a top surface and a bottom surface, wherein the bottom surface of the reflective ohmic p type contact contacts the top surface of the top contact;
   a multilayer epitaxial structure including, in series: a GaN p type layer adjacent to the top surface of the ohmic p type contact, a multi-quantum well (MQW), a GaN n type layer, and a buffer layer having a top surface;
   an electrically conductive silicon substrate layer having a top surface and a bottom surface, wherein the bottom surface of the silicon substrate layer contacts the top surface of the buffer layer;
   an ohmic n type contact having a top surface and a bottom surface; and
   an aperture penetrating the ohmic n-type contact, penetrating the electrically conductive silicon substrate layer, and reaching a portion of the top surface of the buffer layer.

2. A semiconductor structure as claimed in claim 1, further comprising:
   a first contact wire connecting the ohmic n type contact to the first electrical connection
   a second electrical connection having a top surface and a bottom surface, wherein the bottom surface of the second electrical connection contacts a second portion of the top surface of the package heatsink; and
   a second contact wire connecting the top contact to the second electrical connection.

3. A semiconductor structure as claimed in claim 2, wherein the silicon diode is configured to serve as an electrostatic discharge device to protect the multilayer epitaxial structure.

4. A semiconductor structure as claimed in claim 1, wherein a resistivity of the silicon substrate is less than 1 k$\Omega$.cm and within the range 0.5 to 100 $\Omega$.cm.

5. A semiconductor structure as claimed in claim 4, wherein the buffer layer is electrically conducting and electrically couples the semiconductor device with the silicon substrate.

6. A semiconductor structure as claimed in claim 5, wherein the buffer layer comprises at least one AlN layer.

7. A semiconductor structure as claimed in claim 6, wherein the bottom surface of the silicon substrate layer is a {111} plane.

8. A semiconductor structure as claimed in claim 1, wherein the bottom surface of the silicon substrate layer comprises at least one groove where at least one side of the groove is a {111} plane.

9. A semiconductor structure as claimed in claim 1, wherein the silicon diode further comprises p and n type silicon layers.

* * * * *